United States Patent
Harb et al.

(10) Patent No.: US 8,488,288 B2
(45) Date of Patent: Jul. 16, 2013

(54) INPUT PROTECTION METHOD WITH VARIABLE TRIPPING THRESHOLD AND LOW PARASITIC ELEMENTS

(75) Inventors: Zaher G. Harb, Round Rock, TX (US); Mark Whittington, Austin, TX (US)

(73) Assignee: National Instruments Corporation, Austin, TX (US)

( * ) Notice: Subject to any disclaimer, the term of this patent is extended or adjusted under 35 U.S.C. 154(b) by 891 days.

(21) Appl. No.: 12/401,656

(22) Filed: Mar. 11, 2009

(65) Prior Publication Data

US 2009/0323241 A1 Dec. 31, 2009

Related U.S. Application Data

(60) Provisional application No. 61/076,405, filed on Jun. 27, 2008.

(51) Int. Cl.
*H02H 3/20* (2006.01)
*H02H 9/04* (2006.01)

(52) U.S. Cl.
USPC ........... 361/91.1; 361/56; 361/91.2; 361/91.5

(58) Field of Classification Search
USPC .................................. 361/91.1, 56, 91.5, 91.2
See application file for complete search history.

(56) References Cited

U.S. PATENT DOCUMENTS

| | | | |
|---|---|---|---|
| 3,742,371 A * | 6/1973 | Seibt et al. | 363/18 |
| 3,796,944 A * | 3/1974 | Bur, III | 323/234 |
| 4,473,857 A | 9/1984 | Winter | |
| 4,479,266 A * | 10/1984 | Eumurian et al. | 327/72 |
| 4,930,037 A | 5/1990 | Woo | |
| 5,371,395 A | 12/1994 | Hawkins | |
| 5,483,093 A | 1/1996 | Murakami | |
| 5,973,900 A | 10/1999 | Sher | |
| 6,288,590 B1 | 9/2001 | Sandhu | |
| 6,529,355 B1 | 3/2003 | Becker et al. | |
| 6,965,504 B2 | 11/2005 | Liu et al. | |
| 7,038,898 B1 | 5/2006 | Pasqualini | |
| 7,079,368 B2 * | 7/2006 | Ishikawa et al. | 361/93.1 |
| 7,239,176 B2 | 7/2007 | Gupta | |
| 7,463,068 B2 | 12/2008 | Lee et al. | |
| 7,511,930 B2 * | 3/2009 | Apfel | 361/55 |
| 7,619,862 B2 | 11/2009 | Hung | |
| 7,626,790 B2 | 12/2009 | Hung | |
| 7,660,090 B1 | 2/2010 | Daugherty | |
| 7,696,807 B2 | 4/2010 | Takahashi | |

FOREIGN PATENT DOCUMENTS

JP 2003-263231 * 9/2003

* cited by examiner

*Primary Examiner* — Rexford Barnie
*Assistant Examiner* — Zeev V. Kitov
(74) *Attorney, Agent, or Firm* — Meyertons Hood Kivlin Kowert & Goetzel, P.C.; Jeffrey C. Hood

(57) ABSTRACT

Various embodiments of an input protection circuitry may be configured with a variable tripping threshold and low parasitic elements, which may prevent a signal from propagating into the protected equipment/device if the voltage of the input signal exceeds a certain limit. The input protection circuit may operate to protect a measurement instrument, which may be an oscilloscope, early in the signal path leading into to the instrument, to avoid exposing sensitive circuitry to damaging voltage levels, and without introducing significant parasitic elements that would degrade the performance of the instrument. The protection circuit may be configured to include clamping to provide protection during the circuit response delay time. The input protection threshold of the protection circuit may be adaptive to a selected voltage range on the instrument without trading-off instrument performance and features.

25 Claims, 3 Drawing Sheets

INPUT PROTECTION METHOD WITH VARIABLE TRIPPING THRESHOLD AND LOW PARASITIC ELEMENTS

PRIORITY CLAIM

This application claims benefit of priority of provisional application Ser. No. 61/076,405 titled "Input Protection Method with Variable Tripping Threshold and Low Parasitic Elements", filed on Jun. 27, 2008, whose inventors are Zaher Harb and Mark Whittington, and which is hereby incorporated by reference as though fully and completely set forth herein.

FIELD OF THE INVENTION

The present invention relates to the field of instrumentation, and more particularly to an input protection circuit with variable tripping threshold and low parasitic elements.

DESCRIPTION OF THE RELATED ART

In many industrial applications (and others), instruments collect data or information from an environment or unit under test (UUT), and may also analyze and process acquired data. Some instruments provide test stimuli to a UUT. Examples of instruments include oscilloscopes, digital multimeters, pressure sensors, arbitrary waveform generators, digital waveform generators, etc. The information that may be collected by respective instruments includes information describing voltage, resistance, distance, velocity, pressure, oscillation frequency, humidity, and/or temperature, among others. Computer-based instrumentation systems typically include transducers for capturing a physical phenomenon and generating a representative electrical signal, signal conditioning logic to perform amplification on the electrical signal, isolation, and/or filtering, and analog-to-digital (A/D) conversion logic for receiving analog signals and providing corresponding digital signals to the host computer system.

In a computer-based system, the instrumentation hardware or device is typically an expansion board plugged into one of the I/O slots of the computer system. In another common instrumentation system configuration, the instrumentation hardware is coupled to the computer system via other means such as through a VXI (VME extensions for Instrumentation) bus, a GPIB (General Purpose Interface Bus), a PXI (PCI extensions for Instrumentation) bus, Ethernet, a serial port or bus, or parallel port of the computer system. The instrumentation hardware may include a DAQ (Data Acquisition) board, a computer-based instrument such as a multimeter, or another type of instrumentation device. In another common system configuration, a chassis and boards inserted in the chassis may operate as a standalone instrument or instrument suite, although in some cases a host computer may be used to configure or program the boards prior to, or during operation.

The instrumentation hardware may be configured and controlled by software executing on a host computer system coupled to the system, or by a controller card installed in the chassis. The software for configuring and controlling the instrumentation system typically includes driver software and the instrumentation application software, or the application. The driver software serves to interface the instrumentation hardware to the application and is typically supplied by the manufacturer of the instrumentation hardware or by a third party software vendor. The application is typically developed by the user of the instrumentation system and is tailored to the particular function that the user intends the instrumentation system to perform. The instrumentation hardware manufacturer or third party software vendor sometimes supplies application software for applications that are common, generic, or straightforward. Instrumentation driver software provides a high-level interface to the operations of the instrumentation device. The instrumentation driver software may operate to configure the instrumentation device for communication with the host system and to initialize hardware and software to a known state. The instrumentation driver software may also maintain a soft copy of the state of the instrument and initiated operations. Further, the instrumentation driver software communicates over the bus to move the device from state to state and to respond to device requests.

Most instrumentation hardware and/or equipment comprise a form of input protection circuitry that prevents signals from propagating into the equipment if the voltage exceeds a certain limit. This generally helps prevent the protected devices (instrumentation equipment) from being overloaded and destroyed. There are a variety of methods currently in use to implement input protection for electronic equipment. One common over-voltage protection method is the use of diodes to shunt over-voltage fault current to ground or to supply rails. Another method includes the use of a voltage sensing circuit that would trigger an over-voltage condition when the input voltage exceeds a certain threshold voltage. This over-voltage trigger would then isolate the electronic equipment from the damaging voltage by toggling a switching element.

FIG. 3 shows an example of an over-voltage input protection method, where a comparison circuit 208 constantly monitors the input signal at node N1. When the voltage at node N1 exceeds the threshold voltage V_Threshold, comparison circuit 208 will trigger relay control circuit 206 to disengage or open switching element 204, isolating the high voltage from the rest of the circuitry, which is not shown, and may be coupled to node N1. Generally speaking, the input protection method shown in FIG. 3 is based on a voltage sensing circuit triggering an over-voltage condition when an input voltage exceeds a pre-determined threshold voltage, or limit, subsequently isolating the electronic equipment from the damaging voltage by toggling a switching element.

Most instrumentation equipment, and in particular oscilloscopes, allow users to input a wide range of signals having varying voltage levels, with the smallest to highest voltage range typically spanning 50 mV peak-to-peak to 10V peak-to-peak. In order to achieve optimal performance, it is typical to protect against over-voltage as early as possible in the signal path, to avoid exposing sensitive circuitry to damaging voltage levels. However, many problems arise in high performance oscilloscopes, and in particular RF (radio frequency) oscilloscopes, when using the method illustrated in FIG. 3. Significant parasitic elements/components can adversely affect performance, including characteristics such as bandwidth, flatness of frequency response, and input return loss.

As described above, comparison circuit 208 in FIG. 3 is operable to monitor any input voltage level by varying the threshold voltage V_Threshold. Additional mechanisms, potentially introducing additional parasitic elements, may be required however, in order to insure that the clamped voltage at node N1 remains at a safe level, accounting for the time delay to when the comparison circuit actually triggers the overload condition. During this time, the voltage at node N1 may reach high levels and eventually destroy the rest of the circuitry. In addition, comparison circuit 208 has to be designed to withstand high input voltages, which imposes additional requirements, such as using either high voltage components or other complex and more expensive mechanisms, which typically result in higher parasitic elements in the circuit, ultimately degrading the performance of the instrumentation equipment.

Other corresponding issues related to the prior art will become apparent to one skilled in the art after comparing such prior art with the present invention as described herein.

SUMMARY OF THE INVENTION

Various embodiments of a measuring device or instrument may include input protection circuitry configured with a variable tripping threshold and low parasitic elements, which may operate to prevent an input signal from propagating into the protected circuitry of the measuring device if a voltage level of the input signal exceeds a certain threshold voltage. The input protection circuit may operate to protect the measuring instrument, which may be an oscilloscope, early in the signal path that leads to the main (protected) circuitry of the instrument, to avoid exposing sensitive circuitry to damaging voltage levels, and without introducing significant parasitic elements that would degrade the performance of the instrument. The protection circuit may be configured to include clamping to provide protection during the circuit response delay time, and the input protection threshold of the may be adaptive to a selected voltage range on the instrument without trading-off instrument performance and features.

A protection circuit may include an input node configured to receive an input signal, an output node configured to couple to a system, and a control circuit configured to operate according to a specified trip-point corresponding to a specified threshold voltage, where the specified trip may be selected within the control circuit from at least a first and a second different trip-point respectively corresponding to a first and a second different threshold voltage. A first switching element within the protection circuit may be configured to couple/decouple the input node to/from the output node, with the control circuit configured to control the first switching element to decouple the input node from the output node when a control voltage exceeds the specified trip-point as a result of the level of the input signal exceeding the specified threshold voltage, to prevent the input signal from propagating from the input node to the output node. In one set of embodiments, the trip-point circuit may be configured to automatically select the specified trip-point in response to a specific operating voltage range being selected in the system.

The specified trip point may be determined by a voltage drop across a passive circuit component, which may be a resistor, and the voltage drop across the passive circuit component may be determined by a first reference voltage and a node voltage, where the node voltage is higher than a second reference voltage by an aggregate voltage drop across a specified number of active circuit components, which may be diodes. The first trip-point may be generated using a first number of the active circuit components, and the second trip-point may be generated using a second number of the active circuit components, with the first number being greater than the second number. In one set of embodiments, a higher specified number of active circuit components may correspond to a higher trip-point voltage.

A method for providing over-voltage protection to a system may include selecting a specified trip-point voltage corresponding to a specified threshold voltage from at least a first and a second different trip-point voltage respectively corresponding to a first and a second different threshold voltage, receiving an input signal, providing the input signal to the system when a control voltage does not exceed the specified trip-point voltage, and isolating the input signal from the system in response to the control voltage exceeding the specified trip-point in response to the level of the input signal exceeding the specified threshold voltage, to prevent the input signal from propagating into the system. The first threshold voltage may correspond to a first voltage-operating range of the system and the second threshold voltage may correspond to a second voltage operating range of the system. In one set of embodiments, the specified trip-point voltage may be automatically selected in response to selecting a specified voltage operating range from the first voltage operating range and the second voltage operating range.

In one set of embodiments, a measurement device or equipment, which may be an oscilloscope, may be configured with means for establishing a trip-point voltage determined by a supply voltage, a reference voltage, and an aggregate voltage drop across a specified number of first active circuit components. The device may be further configured with means for establishing a control voltage determined by an input voltage and an aggregate voltage drop across a specified number of second active circuit components, means for selecting the specified number of the specified number of first active circuit components to obtain a desired value of the trip-point voltage, and switching means for providing the input voltage to designated circuitry when the control voltage does not exceed the trip-point voltage, and decoupling the input voltage from the designated circuitry when the control voltage exceeds the trip-point voltage.

In one embodiment, the means for selecting the specified number of the specified number of first active circuit components includes means for coupling the selected specified number of first active circuit components between the reference voltage and a control node, to establish at the control node, a voltage higher than the reference voltage by the aggregate voltage drop across the selected specified number of first active circuit components. The means for establishing the control voltage may comprise means for maintaining the control voltage at a same potential as the voltage at the control node until the input voltage reaches a value higher than the reference voltage by more than the aggregate voltage drop across the specified number of second active circuit components. The means for establishing the trip-point voltage may comprise means for establishing a voltage drop across a passive circuit component coupled between the supply voltage and a control node, to provide the trip-point voltage at the control node. The first active circuit components and the second active circuit components may be diodes, while the passive circuit components may be resistors.

Other aspects of the present invention will become apparent with reference to the drawings and detailed description of the drawings that follow.

BRIEF DESCRIPTION OF THE DRAWINGS

A better understanding of the present invention can be obtained when the following detailed description of the preferred embodiment is considered in conjunction with the following drawings, in which.

Figure 1:
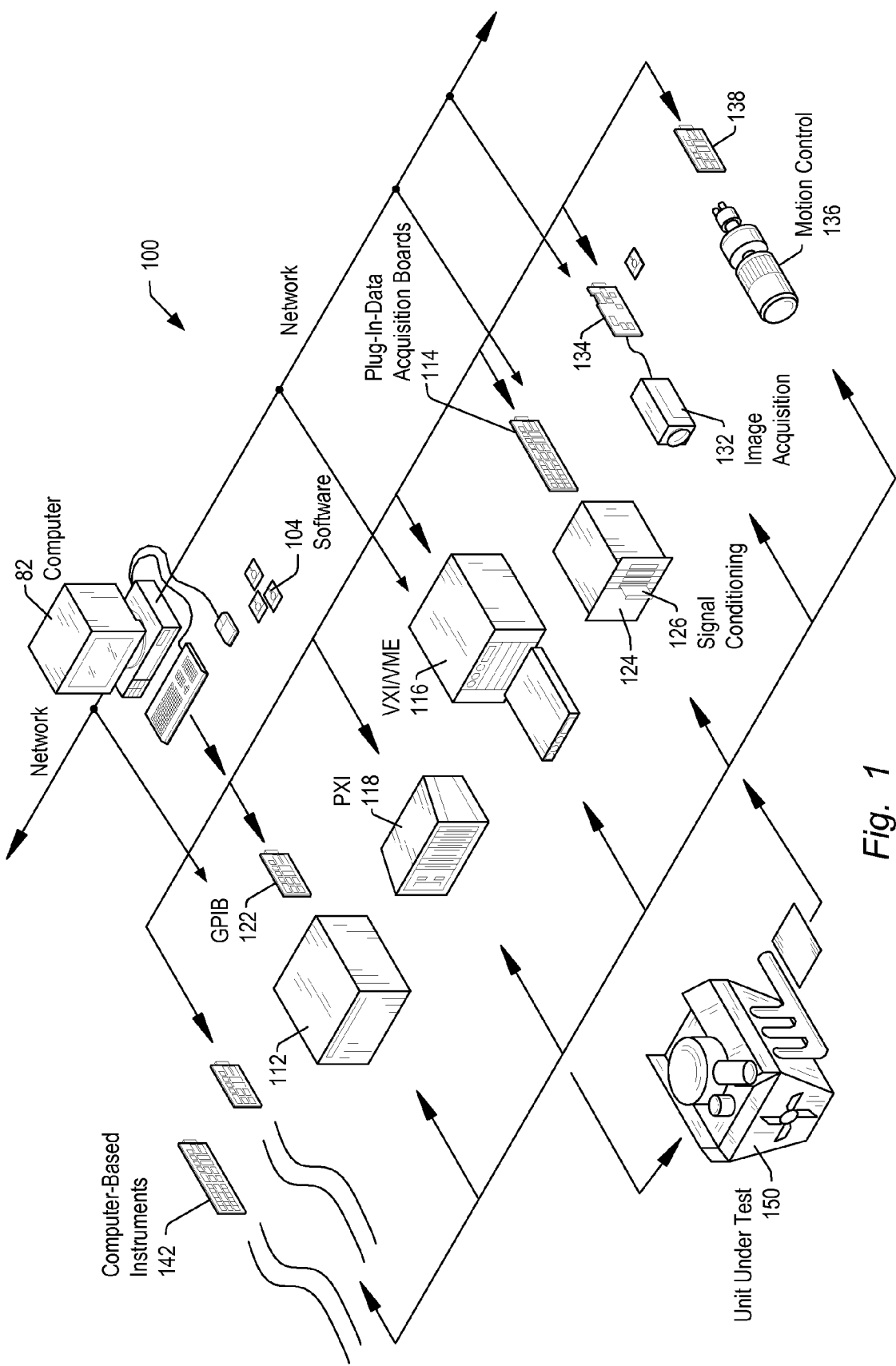
FIG. 1 shows an instrumentation control system with instruments networked together according to one embodiment of the invention.

While the invention is susceptible to various modifications and alternative forms, specific embodiments thereof are shown by way of example in the drawings and are herein described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Embodiments of the present invention may be used in systems configured to perform test and/or measurement functions, to control and/or model instrumentation or industrial automation hardware, or to model and simulate functions, e.g., modeling or simulating a device or product being developed or tested, etc. More specifically, it may be used in various instances where input protection for instrumentation equipment is required, without degrading the performance of the protected instrumentation equipment. However, it is noted that the present invention may equally be used for a variety of applications, and is not limited to the applications enumerated above. In other words, applications discussed in the present description are exemplary only, and the present invention may be used in any of various types of systems. Thus, the system and method of the present invention is operable to be used in any of various types of applications.

FIG. 1 illustrates an exemplary instrumentation control system 100 which may be configured according to embodiments of the present invention. System 100 comprises a host computer 82 which may couple to one or more instruments configured to perform a variety of functions using timing control implemented according to various embodiments of the present invention. Host computer 82 may comprise a CPU, a display screen, memory, and one or more input devices such as a mouse or keyboard as shown. Computer 82 may operate with one or more instruments to analyze, measure, or control a unit under test (UUT) or process 150. The one or more instruments may include a GPIB instrument 112 and associated GPIB interface card 122, a data acquisition board 114 inserted into or otherwise coupled with chassis 124 with associated signal conditioning circuitry 126, a VXI instrument 116, a PXI instrument 118, a video device or camera 132 and associated image acquisition (or machine vision) card 134, a motion control device 136 and associated motion control interface card 138, and/or one or more computer based instrument cards 142, among other types of devices.

The computer system may couple to and operate with one or more of these instruments. In some embodiments, the computer system may be coupled to one or more of these instruments via a network connection, such as an Ethernet connection, for example, which may facilitate running a high-level synchronization protocol between the computer system and the coupled instruments. The instruments may be coupled to the unit under test (UUT) or process 150, or may be coupled to receive field signals, typically generated by transducers. System 100 may be used in a data acquisition and control applications, in a test and measurement application, an image processing or machine vision application, a process control application, a man-machine interface application, a simulation application, or a hardware-in-the-loop validation application, among others.

Figure 2:
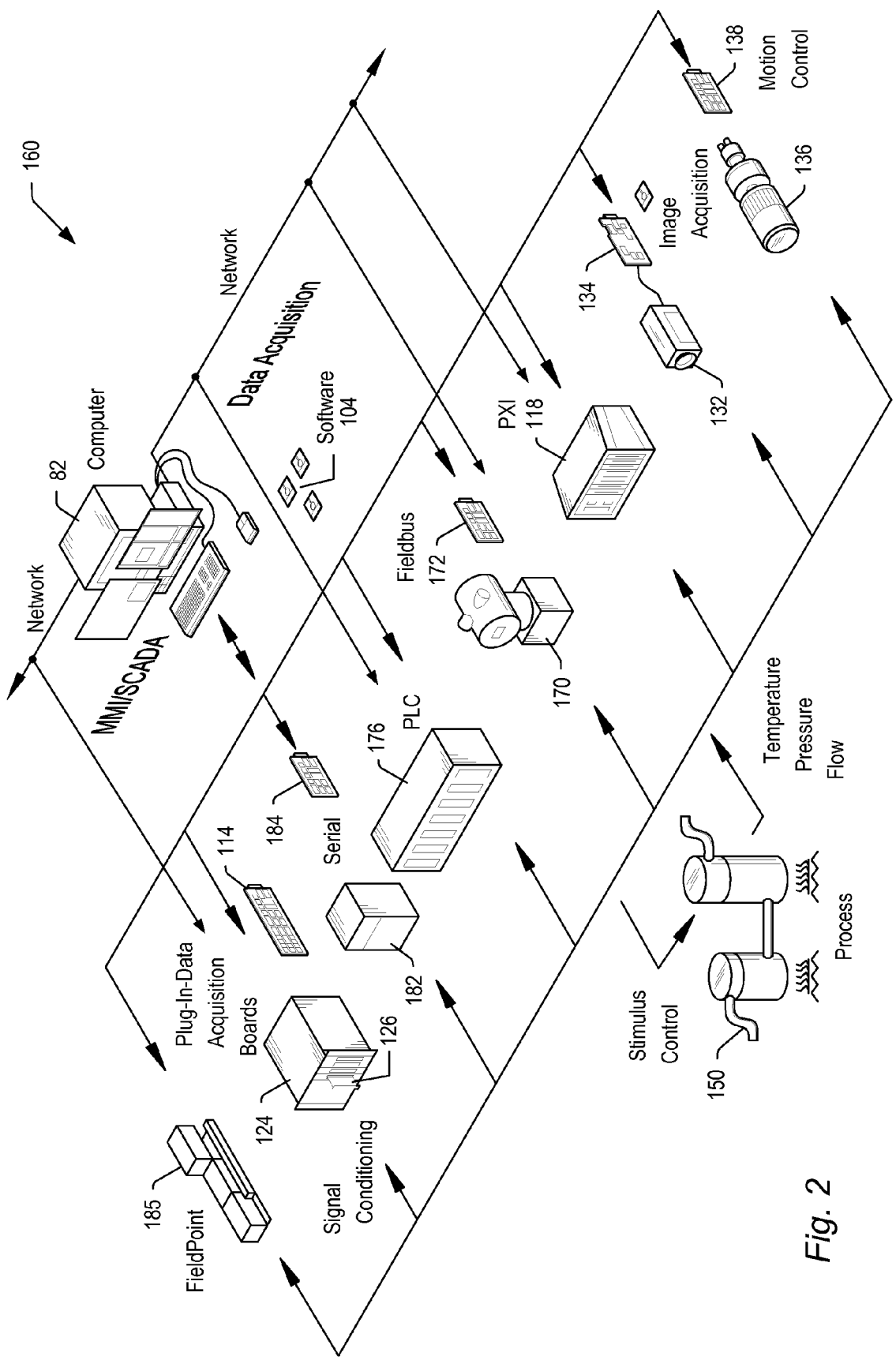
FIG. 2 shows an industrial automation system with instruments networked together according to one embodiment of the invention.
Figure 3:
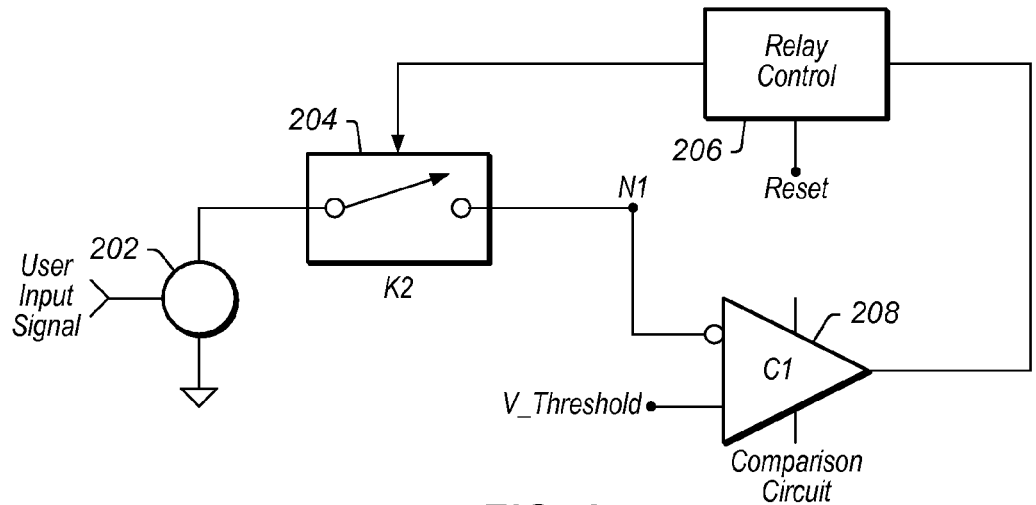
FIG. 3 shows a voltage sense input protection circuit designed according to prior art principles.

FIG. 2 illustrates an exemplary industrial automation system 160 that may be configured according to embodiments of the present invention. Industrial automation system 160 may be similar to instrumentation or test and measurement system 100 shown in FIG. 2A. Elements that are similar or identical to elements in FIG. 1 have the same reference numerals for convenience. System 160 may comprise a computer 82 which may couple to one or more devices and/or instruments configured to perform a variety of functions using timing control implemented according to various embodiments of the present invention. Computer 82 may comprise a CPU, a display screen, memory, and one or more input devices such as a mouse or keyboard as shown. Computer 82 may operate with the one or more devices and/or instruments to perform an automation function, such as MMI (Man Machine Interface), SCADA (Supervisory Control and Data Acquisition), portable or distributed data acquisition, process control, and advanced analysis, among others, on process or device 150.

The one or more devices may include a data acquisition board 114 inserted into or otherwise coupled with chassis 124 with associated signal conditioning circuitry 126, a PXI instrument 118, a video device 132 and associated image acquisition card 134, a motion control device 136 and associated motion control interface card 138, a field bus device 170 and associated field bus interface card 172, a PLC (Programmable Logic Controller) 176, a serial instrument 182 and associated serial interface card 184, or a distributed data acquisition system, such as the Compact FieldPoint or CompactRIO systems available from National Instruments, among other types of devices. In some embodiments, similar to the system shown in FIG. 1, the computer system may couple to one or more of the instruments/devices via a network connection, such as an Ethernet connection.

Figure 4:
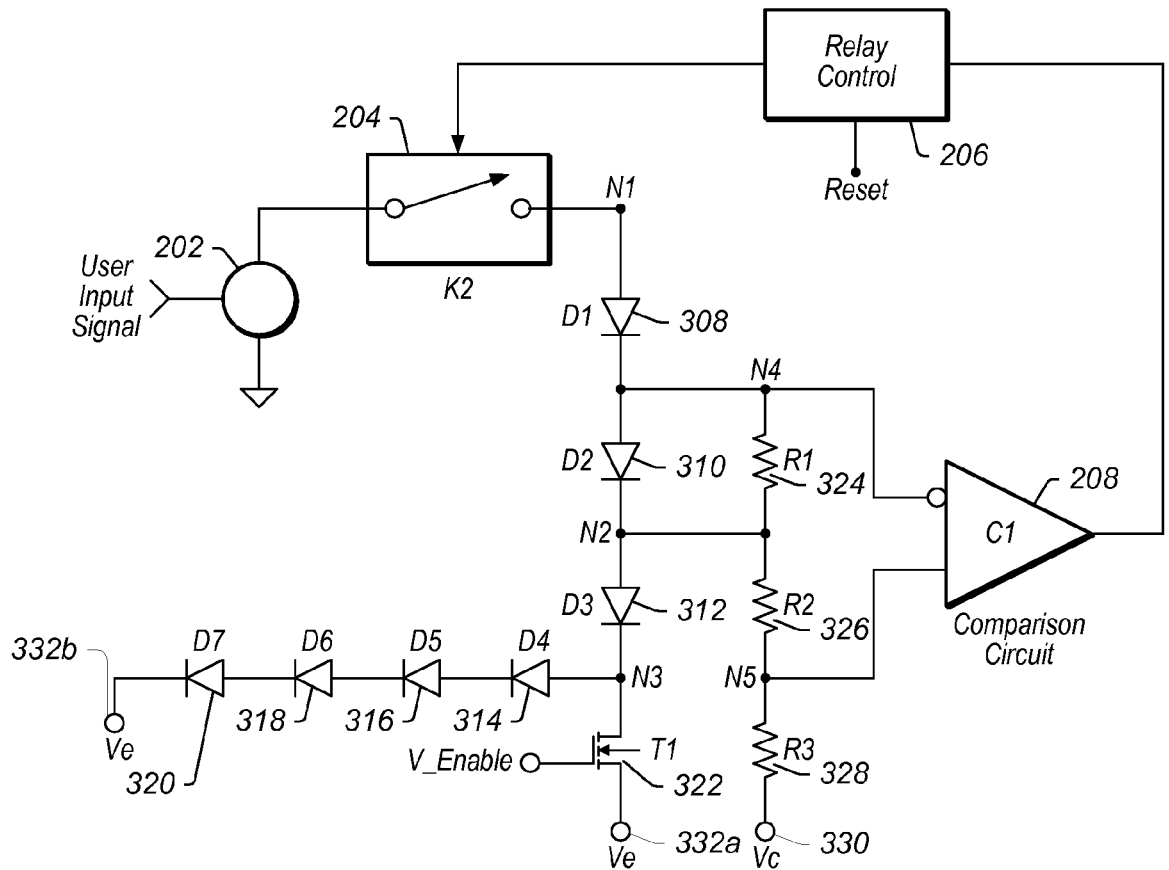
FIG. 4 shows one embodiment of an input protection circuit configured with a variable tripping threshold and low parasitic elements.

FIG. 4 illustrates an input protection circuit comprising a variable tripping threshold and low parasitic elements, configured according to one embodiment of the present invention. The input protection circuit may be used to couple input signals 202 to a measuring instrument/equipment to be protected, such as an oscilloscope, which may be configured in a system such as the one shown in FIG. 1 and/or FIG. 2. Though not shown in FIG. 4, the measuring instrument/equipment may be coupled to node N1, which may serve as the input to the measuring equipment. In addition, in certain embodiments the measuring equipment may implement the protection circuit shown in FIG. 4 internally. Those skilled in the art will appreciate that various embodiments in which the protection circuit is external or internal to the measuring device are possible. The input protection circuit may be configured to prevent an input signal from propagating into the protected device/equipment, when the voltage level of the input signal exceeds a certain limit. It should be noted, that as used herein, the term "protected circuit", "protected equipment" and the like are meant to indicate a system/equipment/circuitry that may be protected by embodiments of the disclosed protection circuit. In other words, protected circuit(s) may refer to all systems, equipment, or other circuit elements whose input(s) may be intercepted by the protections circuit, to prevent higher than desired voltages from propagating into the protected circuit(s). Therefore, the protection circuit may be configured to protect the equipment/system/circuit(s) from over-voltage conditions of one or more input signals.

The circuit shown in FIG. 4 may be configured with active (e.g. diodes and/or transistors) and passive (e.g. resistors and/or capacitors) elements to form a variable trip-point input protection circuit with low parasitic elements. By establishing more than one trip-point, there may no longer be a need to trade-off instrument performance and features. The circuit (of FIG. 4) may be configured to operate within at least two voltage ranges, a high voltage range and a low voltage range. The value of the high voltage range may be relative to the low voltage range, and may be established as required according to various system considerations. When operating in the high voltage range, the circuit may operate to protect against over-voltage of high voltage signals, by setting the comparison or threshold voltage to a relatively high value. Similarly, when operating in the low voltage range, the circuit may operate to protect against over-voltage of low voltage signals, by setting the comparison or threshold voltage to a relatively low value.

While the circuit may comprise additional active elements compared to many prior art solutions, only the inherent parasitic elements of diode 308 may need to be accounted for, and possibly controlled, in order to prevent performance degradation of the protected instrument/device (e.g. oscilloscope). Diode 308 may be implemented in a variety of possible ways. In one embodiment, it may comprise the collector base junction of an off-the-shelf RF transistor, or any diode like active element, provided that its intrinsic parasitic elements are insignificant or can be controlled in a manner that prevents any degradation of the instrument's performance.

The intrinsic parasitic elements of the remainder of the active components in the protection circuit (such as diodes 310 to 320, and transistor 322) may be configured such that their intrinsic parasitic elements do not degrade the instrument's (e.g. oscilloscope's) performance factors, including bandwidth, flatness of frequency response, and input return loss. The remaining active components may be selected according to a variety of specific criteria. In one set of embodiments, these components may be low cost solid state devices with much more relaxed specifications regarding their intrinsic parasitic elements, made possible by configuring active element 308 to isolate the parasitic elements of the protection circuitry from the main signal leading into the protected instrument (e.g. oscilloscope).

The protection circuit in FIG. 4 may operate as follows. Resistive elements (e.g. resistors) 326 and 328 may be configured to form a voltage divider, and also provide bias current to active elements (e.g. diodes) 312, 314, 316, 318, and 320 (with switching element 322 turned off). While the active elements shown in FIG. 4 are diodes, those skilled in the art will appreciate that other active elements having characteristics identical or similar to diodes may be used, and that various embodiments of the present invention are not limited to the diodes explicitly disclosed herein. One example of active components configured as diodes in the circuit may include diode-connected transistors, e.g. MOSFETs (metal-oxide semiconductor field effect transistors) having their respective gate and drain terminals coupled together, or BJTs (bipolar junction transistors) having their respective base and collector junctions connected together). A user (or extrinsic program, circuitry, etc.) may be configured to select between two operating modes corresponding to a high operating voltage range and a low operating voltage range, respectively. In one embodiment, the operating mode/range may be selected via the V_Enable signal applied to the control terminal of the switching device 322.

When a high operating voltage range is selected on the measurement instrument/device (e.g. on an oscilloscope), a high comparison voltage may be enforced at node N5 by disabling switching element 322, which may be implemented as any one of a variety of different types of switching elements, and is shown in FIG. 4 in its simplest form as a FET (field effect transistor) switch. As seen from the circuit configuration shown in FIG. 4, the relative values of voltage Vc and Ve may determine the voltage at node N5. Thus, Ve may be considered a first reference voltage, and Vc may be considered a second reference voltage, where the respective values of the two reference voltages may be selected to determine the actual value of the high comparison voltage corresponding to the high operating voltage range, and by consequence the value of the low comparison voltage corresponding to the low operating voltage range. In order for current to flow toward the node configured at voltage value Ve, the voltage Ve may be selected to have a lower value than voltage Vc. As previously mentioned, switching element 204 being open means that no signal is provided to node N1, and resistors 328 and 326 may operate to provide a bias current to diodes 312, 314, 316, 318, and 320, when switching element 322 is turned off (or, in other words, when switching element 322 is disabled).

The high voltage comparison threshold may be obtained as follows. The voltage created at node N2 (by biasing diodes 312, 314, 316, 318, and 320) may have a value equivalent to a first number of active circuit component (e.g. diode) voltage drops above a reference voltage Ve. In other words, the voltage generated at node N2 may have a value that is greater than the reference voltage Ve by a specific first voltage value, where the specific first voltage value corresponds to (i.e. it may be obtained as) an aggregate voltage drop across a first number of active elements, in this case a first number of diodes. As shown in FIG. 4, the first number is five, as there may be five diodes (312, 314, 316, 318, and 320) coupled in series between node N2 and node 322b residing at the reference voltage Ve. As mentioned above, a bias current at this point may be established between node 330 (residing at reference voltage Vc) and node 322b, the bias current flowing through resistors 328, 326, and diodes 312, 314, 316, 318, and 320. This may develop a relatively high voltage threshold at node N5, with a value corresponding to Vc minus the voltage drop across resistor 328.

A comparison voltage may thereby be generated at node N5, which represents a tap from the voltage divider comprising resistors 326 and 328. Thus, when switching element 204 is closed, an user input signal 202 is provided to node N1, as long as the input voltage at node N1 does not exceed a value corresponding to the aggregate voltage drop across a second number of active devices, in this case the aggregate voltage drop across two diodes (308 and 310), the voltage at node N4 may remain the same as the voltage at node N2, since no current will be flowing from node N1, and because the voltage at node N5 is at a higher potential than the voltage at node N2, the comparison circuit may not trip any over-voltage condition. When the input voltage at node N1 exceeds a voltage commensurate with two diode voltage drops above the voltage at node N2, current may begin to flow from node N1, and as a consequence the voltage at node N4 may exceed the voltage at node N5, resulting in the comparison circuit triggering relay control circuit 206 to disengage, or open switching element 204, to isolate the user input signal, i.e. the high voltage from the rest of the circuitry.

When a low operating voltage range is selected on the measurement instrument/device (e.g. oscilloscope), a low comparison voltage may be enforced at node N5 by enabling switching element 322. The voltage created at node N2 may have a value equivalent to a third number of active element (e.g. diode) voltage drops above reference voltage Ve. In other words, the voltage generated at node N2 may have a value that is greater than the reference voltage Ve by a specific third voltage value, where the specific third voltage value corresponds to (i.e. it may be obtained as) an aggregate voltage drop across a third number of active elements, in this case a third number of diodes. As shown in FIG. 4, this third number is one, as there is a single diode 312 coupled in series between node N2 and node N3. With switching element 322 enabled, a current path may be established between nodes 330 and 332a, and because only one active element with notable voltage drop is configured in that path (the drain-source voltage VDS of switching device 322 may be considered comparatively small to a diode voltage drop), the voltage drop across resistor 328 may be greater than in the previous case (when FET 322 is disabled), resulting in the lower voltage comparison threshold at node N5.

Thus, when switching element 204 is closed, an user input signal 202 is provided to node N1, as long as the input voltage at node N1 does not exceed a value corresponding to the aggregate voltage drop across the second number of active devices, i.e. it does not exceed two diode voltage drops above node N2 in this case, the voltage at node N4 may remain at the same level as the voltage at node N2, for the same reasons as stated above with reference to the higher voltage comparison threshold. At this point, since the voltage at node N5 may reside at a higher potential, the comparison circuit may not trip any over-voltage condition. However, when the input voltage at node N1 exceeds two diode voltage drops above node N2, the voltage at node N4 may exceed the voltage at node N5, and the comparison circuit may trigger the relay control circuit to disengage, or open the switching element K2, to isolate the high voltage from the rest of the circuitry.

Those skilled in the art will appreciate that various embodiments of the input protection circuit disclosed herein may be constructed using a different number of active and/or passive circuit components while retaining the overall functionality of the circuit, and that the number of these circuit elements and the value of the reference voltages as well as the value of the passive circuit elements may be specified according to system considerations and requirements. In addition, it should be well understood that the protection circuit may equally be used with a wide variety of circuits, systems, and/or measuring equipment to protect the system from over-voltage conditions at the input. Protection circuits designed according to the principles set forth herein may be standalone circuits or may be configured as part of the equipment/system which they are intended to protect.

Input voltage protection circuits configured according to the embodiments disclosed herein may protect a system/measuring instrument/device, e.g. an oscilloscope, early in the signal path to avoid exposing sensitive circuitry to damaging voltage levels, and without introducing significant parasitic elements that would degrade the performance of the system/measuring instrument/device, e.g. an oscilloscope. Various embodiments of the protection circuit may be designed with a clamping configuration to provide protection during the circuit response delay time. A protection threshold may also be configured to adapt to the selected voltage range on the measuring instrument without trading-off instrument performance and features.

Although the embodiments above have been described in considerable detail, numerous variations and modifications will become apparent to those skilled in the art once the above disclosure is fully appreciated. It is intended that the following claims be interpreted to embrace all such variations and modifications.

We claim:

1. A protection circuit comprising:
    an input node configured to receive an input signal;
    an output node configured to couple to a system;
    a control circuit configured to operate according to a specified trip-point voltage corresponding to a specified threshold voltage, wherein the specified trip point voltage is selectable independently of the input signal from among at least a first and a second different trip-point voltage respectively corresponding to a first and a second different threshold voltage; and
    a first switching element configured to couple/decouple the input node to/from the output node;
    wherein the control circuit is configured to control the first switching element to decouple the input node from the output node when a control voltage exceeds the specified trip-point voltage as a result of the level of the input signal exceeding the specified threshold voltage, to prevent the input signal from propagating from the input node to the output node wherein the control circuit is configured to automatically select the specified trip-point voltage in response to a specific operating voltage range being selected for the system.

2. The protection circuit of claim 1, wherein the control circuit is configured to automatically select the specified trip-point voltage in response to a specific operating voltage range being selected for the system.

3. The protection circuit of claim 1;
    wherein the specified trip point voltage is determined by a voltage drop across a passive circuit component; and
    wherein the voltage drop across the passive circuit component is determined by a first reference voltage and a node voltage, wherein the node voltage is higher than a second reference voltage by an aggregate voltage drop across a specified number of active circuit components.

4. The protection circuit of claim 1;
    wherein the specified number of active circuit components comprises a first number of active circuit components for the first trip-point voltage;
    wherein the specified number of active circuit components comprises a second number of active circuit components for the second trip-point voltage; and
    wherein the first number is higher than the second number.

5. The protection circuit of claim 4, wherein a higher specified number of active circuit components corresponds to a higher trip-point voltage.

6. The protection circuit of claim 3, wherein the passive circuit component is a resistor and the active circuit components are diodes.

7. A method for providing over-voltage protection to a system, the method comprising:
    selecting a specified trip-point voltage corresponding to a specified threshold voltage from at least a first and a second different trip-point voltage respectively corresponding to a first and a second different threshold voltage;
    receiving an input signal at an input of the system;
    providing the input signal from the input of the system to the system when a control voltage does not exceed the specified trip-point voltage;
    prevent the input signal from propagating into the system by isolating the input signal from the system in response to the control voltage exceeding the specified trip-point voltage responsive to the level of the input signal exceeding the specified threshold voltage;
    wherein the first threshold voltage corresponds to a first voltage-operating range of the system and the second threshold voltage corresponds to a second voltage-operating range of the system; and
    wherein said selecting is performed independently of the input signal wherein the control circuit is configured to automatically select the specified trip-point voltage in response to a specific operating voltage range being selected for the system.

8. The method of claim 7;
wherein said receiving comprises receiving the input signal at an input node;
wherein said providing comprises operating a switch to couple the input node to an output node coupled to the system; and
wherein said isolating comprises operating the switch to isolate the input node from the output node.

9. The method of claim 7, further comprising:
selecting a specified voltage operating range from the first voltage operating range and the second voltage operating range;
wherein said selecting the specified trip-point voltage is automatically performed in response to said selecting the specified voltage operating range.

10. The method of claim 7, further comprising:
generating a node voltage that is higher than a first reference voltage by an aggregate voltage drop across a specified number of active circuit components; and
generating the trip-point voltage from the node voltage and a second reference voltage higher than the first reference voltage.

11. The method of claim 10, further comprising:
selecting one of:
the first voltage operating range; or
the second voltage operating range;
wherein said selecting the specified trip-point voltage comprises:
generating the first trip-point voltage by setting the node voltage to be higher than the first reference voltage by an aggregate voltage drop across a first number of the active circuit components, in response to said selecting the first voltage operating range; and
generating the second trip-point voltage by setting the node voltage to be higher than the first reference voltage by an aggregate voltage drop across a second number of the active circuit components, in response to said selecting the second voltage operating range;
wherein the first number is lower than the second number.

12. The method of claim 11;
wherein said setting the node voltage to be higher than the first reference voltage by an aggregate voltage drop across a first number of the active circuit components comprises enabling a switching element; and
wherein said setting the node voltage to be higher than the first reference voltage by an aggregate voltage drop across a second number of the active circuit components comprises disabling the switching element.

13. The method of claim 7, further comprising:
clipping the input signal to a voltage level near the specified threshold voltage, subsequent to the input signal exceeding the specified threshold voltage, until said isolating is performed.

14. A system comprising:
a first switching element having an output terminal configured to couple to protected circuitry, and an input terminal configured to receive an input signal; and
a protection circuit configured to control the first switching element to:
decouple the input terminal from the output terminal to prevent the input signal from propagating from the input terminal to the protected circuitry when a control voltage exceeds a specified trip-point voltage in response to the level of the input signal exceeding a specified threshold voltage; and
couple the input terminal to the output terminal to propagate the input signal from the input terminal to the protected circuitry when the control voltage does not exceed the specified trip-point voltage;
wherein the specified trip point voltage is selectable independently of the input signal from among at least two different trip-point voltages respectively corresponding to two different threshold voltages wherein the control circuit is configured to automatically select the specified trip-point voltage in response to a specific operating voltage range being selected for the system.

15. The system of claim 14, wherein the protection circuit comprises:
at least one active circuit component coupled between the output terminal and a first control node, wherein the first control node is configured to provide the control voltage;
two or more active circuit components coupled in series between a second control node and a reference voltage, wherein a voltage developed at the second control node is higher than the reference voltage by an aggregate voltage drop across a specified number of the two or more active circuit components; and
a voltage divider coupled between the second control node and a supply voltage, wherein the voltage divider comprises:
a third control node configured to provide the trip-point voltage; and
a first passive circuit element coupled between the supply voltage and the third control node.

16. The system of claim 15, wherein the protection circuit further comprises:
a comparator having a first input coupled to the first control node, a second input coupled to the third control node, and an output configured to control the first switching element.

17. The system of claim 15, wherein the protection circuit further comprises:
at least one additional active circuit component coupled between the first control node and the second control node; and
at least one additional passive circuit element coupled between the first control node and the second control node.

18. The system of claim 15, wherein the protection circuit further comprises:
a second switching element coupled between a fourth control node and the reference voltage, wherein the fourth control node is configured between two of the two or more active circuit components;
wherein the second switching element is configured to establish one of the at least two different trip-point voltages at the third control node when enabled, and establish another one of the at least two different trip-point voltages at the third control node when disabled.

19. The system of claim 14, further comprising the protected circuitry, wherein the system is a measuring device.

20. A system comprising:
means for establishing a trip-point voltage determined by a supply voltage, a reference voltage, and an aggregate voltage drop across a specified number of first active circuit components;
means for establishing a control voltage determined by an input voltage and an aggregate voltage drop across a specified number of second active circuit components;
means for selecting the specified number of the specified number of first active circuit components independently of the input voltage to obtain a desired value of the trip-point voltage;

switching means for providing the input voltage to designated circuitry when the control voltage does not exceed the trip-point voltage, and decoupling the input voltage from the designated circuitry when the control voltage exceeds the trip-point voltage wherein the control circuit is configured to automatically select the specified trip-point voltage in response to a specific operating voltage range being selected for the system.

21. The system of claim 20, wherein said means for selecting the specified number of the specified number of first active circuit components comprises means for coupling the selected specified number of first active circuit components between the reference voltage and a control node, to establish, at the control node, a voltage higher than the reference voltage by the aggregate voltage drop across the selected specified number of first active circuit components.

22. The system of claim 21, wherein said means for establishing the control voltage comprise means for maintaining the control voltage at a same potential as the voltage at the control node until the input voltage reaches a value higher than the reference voltage by more than the aggregate voltage drop across the specified number of second active circuit components.

23. The system of claim 20, wherein the first active circuit components and the second active circuit components are diodes.

24. The system of claim 20, wherein said means for establishing the trip-point voltage comprise means for establishing a voltage drop across a passive circuit component coupled between the supply voltage and a control node, to provide the trip-point voltage at the control node.

25. The system of claim 20, wherein the system is an oscilloscope, and the input voltage corresponds to an input signal to the oscilloscope.

* * * * *